(12) United States Patent
Wajima et al.

(10) Patent No.: US 6,744,179 B2
(45) Date of Patent: Jun. 1, 2004

(54) PIEZOELECTRIC RESONATOR AND PIEZOELECTRIC OSCILLATOR

(75) Inventors: Masaya Wajima, Shinminato (JP); Kenichi Kotani, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/740,913

(22) Filed: Dec. 20, 2000

(65) Prior Publication Data
US 2001/0030490 A1 Oct. 18, 2001

(30) Foreign Application Priority Data

Dec. 20, 1999 (JP) ............................................. 11-361546

(51) Int. Cl.[7] ............................................. H01L 41/08
(52) U.S. Cl. ....................................... 310/344; 310/340
(58) Field of Search ............................... 310/320, 340, 310/344, 348

(56) References Cited

U.S. PATENT DOCUMENTS

| | | | |
|---|---|---|---|
| 4,283,650 A | * 8/1981 | Koyama et al. | ............ 310/344 |
| 5,102,720 A | 4/1992 | Raj | |
| 5,459,368 A | * 10/1995 | Onishi et al. | ............ 310/344 X |
| 5,699,027 A | * 12/1997 | Tsuji et al. | ............ 310/348 X |
| 5,889,357 A | * 3/1999 | Yachi et al. | ................ 310/344 |
| 6,160,462 A | * 12/2000 | Sugiyama et al. | ...... 310/348 X |
| 6,215,229 B1 | * 4/2001 | Kuroda et al. | .......... 310/348 X |
| 6,274,968 B1 | * 8/2001 | Wajima et al. | .............. 310/348 |

FOREIGN PATENT DOCUMENTS

| | | |
|---|---|---|
| JP | 3-247010 | 11/1991 |
| JP | 4-4604 | 1/1992 |
| JP | 4-192709 | 7/1992 |
| JP | 5-18120 | 3/1993 |
| JP | 5-59956 | 8/1993 |
| JP | 2-666295 | 6/1997 |
| JP | 9-208261 | 8/1997 |
| JP | 2-839092 | 10/1998 |
| JP | 11-177374 | 7/1999 |

* cited by examiner

*Primary Examiner*—Mark Budd
(74) *Attorney, Agent, or Firm*—Keating & Bennett, LLP (57) ABSTRACT

A piezoelectric resonator includes a piezoelectric resonating element, and a first exterior substrate and a second exterior substrate, laminated over and under, respectively, the piezoelectric resonating element. In the piezoelectric resonator, the first exterior substrate and the second exterior substrate each include a multilayer substrate having at least one layer of an internal electrode.

13 Claims, 8 Drawing Sheets

PIEZOELECTRIC RESONATOR AND PIEZOELECTRIC OSCILLATOR

BACKGROUND OF THE INVENTION

1. Field of the Invention

The present invention relates to a piezoelectric resonator and to a piezoelectric oscillator having exterior substrates which are laminated over and under a piezoelectric resonating element, and more particularly, the present invention relates to a piezoelectric resonator and a piezoelectric oscillator for use in, for example, a clock generation oscillator for a microcomputer.

2. Description of the Related Art

Figure 9A:
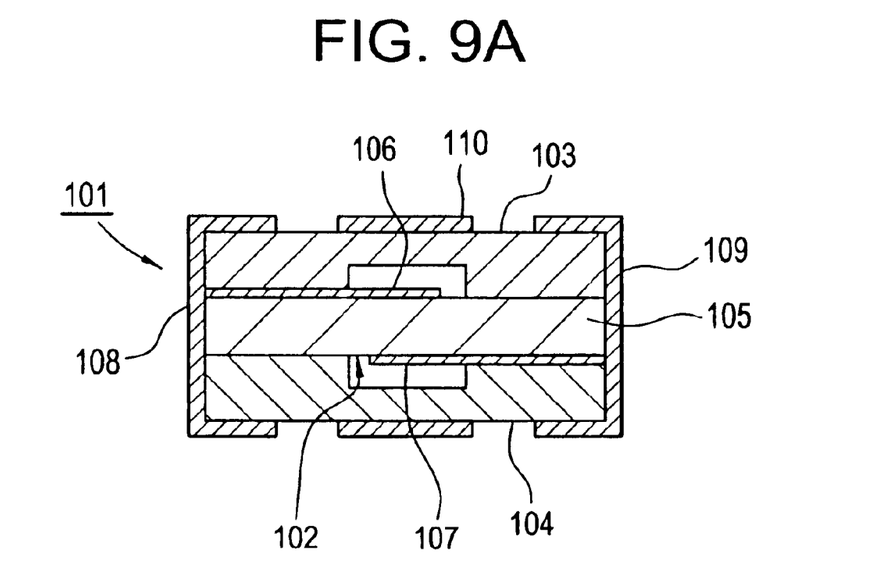
FIG. 9A is a cross sectional view of a conventional piezoelectric component.
Figure 9B:
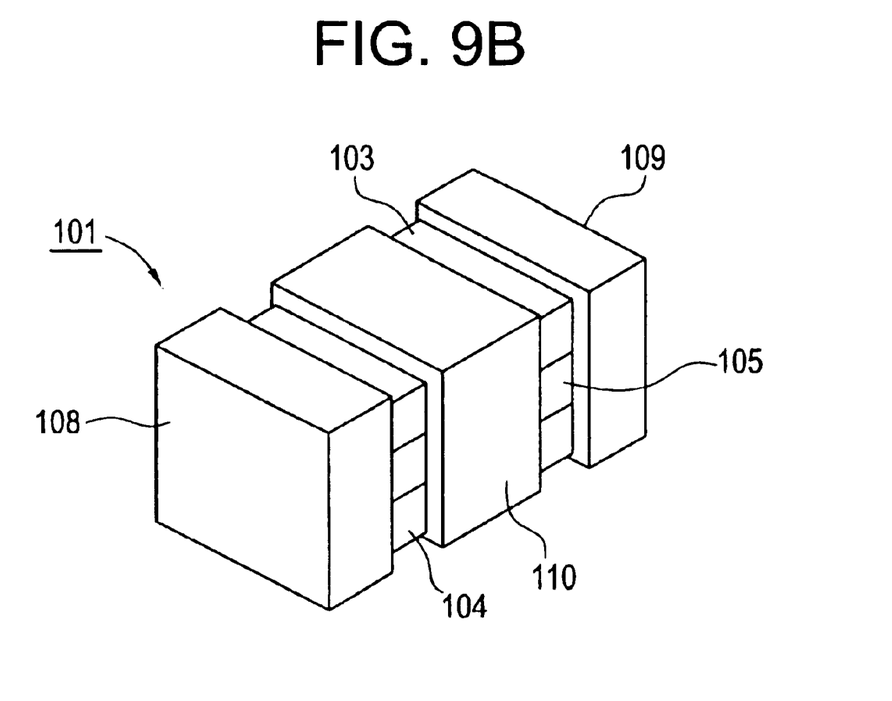
FIG. 9B is a perspective view of the conventional piezoelectric component shown in FIG. 9A.

In the past, piezoelectric resonators constructed by combining a piezoelectric resonating element with a capacitor and built-in load capacitance type piezoelectric oscillators have been proposed. For example, in Japanese Patent No. 2666295, piezoelectric components shown in FIGS. 9A and 9B are disclosed. In a piezoelectric component 101, exterior substrates 103 and 104 are laminated over and under, respectively, a plate-like piezoelectric resonating element 102. The piezoelectric resonating element 102 which includes a piezoelectric diaphragm 105 and excitation electrodes 106 and 107 is an energy-trap type piezoelectric resonator. The excitation electrodes 106 and 107 are arranged to face each other via the piezoelectric diaphragm 105. The excitation electrode 106 is led to one end surface of a laminate body which includes the piezoelectric diaphragm 105 and the exterior substrates 103 and 104. An external electrode 108 is provided on the end surface. The excitation electrode 107 is led to the other end surface of the laminated body and is electrically connected to an external electrode 109 provided on the other end surface.

The external electrodes 108 and 109 are arranged to cover not only end surfaces of the laminated body but also the top surface, a pair of side surfaces, and the bottom surface thereof. In the middle of the laminated body, an external electrode 110 is wound around the bottom surface, the pair of the side surfaces, and the bottom surface thereof.

In the piezoelectric component 101, capacitors are provided between the external electrodes 108 and 110 and between the external electrodes 109 and 110.

The capacitors achieve a high capacitance by using the upper and lower exterior substrates 103 and 104.

In Japanese Patent No. 2839092, Japanese Unexamined Patent Application Publication No. 4-192709, Japanese Unexamined Utility Model Patent Application No. 5-18120, etc., there are disclosed capped piezoelectric components constructed by bonding the piezoelectric resonating element to a package substrate in which a capacitor is provided thereon and then bonding cap material for enclosing the piezoelectric resonating element.

In these capped piezoelectric components, the package substrate which has the piezoelectric resonating element mounted thereon includes a multilayer substrate. In the multilayer substrate, the capacitor is provided. That is, by providing the capacitor in the package substrate, the piezoelectric component constructed by combining the piezoelectric resonating element with the capacitor is miniaturized.

In the piezoelectric component 101 disclosed in Japanese Patent No. 2666295, capacitors connected to the piezoelectric resonating element 102 are configured by arranging each of the exterior substrates 103 and 104 over and under, respectively, the piezoelectric resonating element 102. Accordingly, a piezoelectric component having a reduced height is provided.

When a capacitor having high capacitance is desired, ceramic substrates having a high dielectric constant must be used as the exterior substrates 103 and 104. Such ceramic substrates have a low deflective strength and are difficult to construct as thin walls. Accordingly, each of the exterior substrates 103 and 104 must be thickened to some extent. This prevents the capacitor from having high capacitance.

When a construction is desired in which the exterior substrates 103 and 104, each of which includes a high dielectric constant ceramic substrate, are laminated over and under, respectively, the piezoelectric resonating element, the laminated body is affixed on an adhesive sheet and then is cut. However, when the laminated body is cut, chipping tends to occur because a high dielectric constant ceramic substrate has reduced workability.

That is, in a construction, such as that of the piezoelectric component 101 in which the exterior substrates 103 and 104 are laminated over and under, respectively, the piezoelectric resonating element 102, a low dielectric constant dielectric ceramic substrate which has excellent workability must be used as one of the upper and lower exterior substrates 103 and 104. This prevents the capacitor from having high capacitance.

On the other hand, in the above-described capped piezoelectric component, a cap such as a metal cap is bonded to the top surface of the package substrate. Since the package substrate has a larger planar shape than the cap itself, miniaturization of the piezoelectric component is difficult. In addition, the capacitor cannot be constructed in the cap, and it is constructed exclusively in the package substrate. Therefore, it is difficult to construct the capacitor having high capacitance. Since the capacitor must be constructed exclusively in the package substrate, the dimensions of the package substrate must be increased in this respect as well.

SUMMARY OF THE INVENTION

To overcome the above-described problems, preferred embodiments of the present invention provide a piezoelectric resonator having exterior substrates which are laminated over and under a piezoelectric resonating element. The resonator solves the above-described problems such that the resonator is miniaturized and shortened, and a capacitor having high capacitance is achieved.

Further, preferred embodiments of the present invention provide a built-in load capacitance type piezoelectric oscillator in which a three-terminal capacitor is connected to the piezoelectric resonating element that is miniaturized and shortened, so as to provide a capacitor having very high capacitance with no disadvantages.

To this end, according to a first preferred embodiment of the present invention, a piezoelectric resonator includes a piezoelectric resonating element, and a first exterior substrate and a second exterior substrate, laminated over and under, respectively, the piezoelectric resonating element. In the piezoelectric resonator, the first exterior substrate and the second exterior substrate each include a multilayer substrate having at least one layer of an internal electrode.

In the piezoelectric resonator, each of the first exterior substrate and the second exterior substrate have a first internal electrode and a second internal electrode provided via a substrate material layer, and have a capacitor provided therein.

The first exterior substrate and the second exterior substrate each include a pair of a first internal electrode and a second internal electrode provided at the same height level, and a third internal electrode provided with the first and second internal electrodes via a substrate material layer. In the piezoelectric resonator, the capacitors are provided between the first internal electrode and the third internal electrode and between the second internal electrode and the third internal electrode, respectively.

In the piezoelectric resonator, alternatively, the first internal electrode of the first exterior substrate and the first internal electrode of the second exterior substrate are connected to a first electric potential and a second electric potential, respectively, and the second internal electrodes of the first exterior substrate and the second exterior substrate are each grounded.

In the piezoelectric resonator, the first exterior substrate and the second exterior substrate each include a first substrate material layer which is liquid-sintered and a second substrate material layer which is not sintered at the sintering temperature of the first substrate material layer.

According to a second preferred embodiment of the present invention, a piezoelectric oscillator is provided including a built-in load capacitance type piezoelectric oscillator having a plate-like piezoelectric resonating element, and a first exterior substrate and a second exterior substrate which are laminated over and under, respectively, the plate-like piezoelectric resonating element, and which constitutes a three-terminal capacitor connected to the plate-like piezoelectric resonating element. In the piezoelectric oscillator, the first exterior substrate and the second exterior substrate each include a multilayer substrate having at least one layer of an internal electrode.

The piezoelectric oscillator further includes an input electrode, an output electrode, and a ground electrode provided on the surface of a laminate body constructed by laminating the plate-like piezoelectric resonating element, the first exterior substrate, and the second exterior substrate. In the piezoelectric oscillator, the input electrode, the output electrode, and the ground electrode are connected to the corresponding terminals of the three-terminal capacitor constituted by the first exterior substrate and the second exterior substrate.

In the piezoelectric oscillator, the first exterior substrate and the second exterior substrate each include a pair of a first internal electrode and a second internal electrode provided at the same level, and a third internal electrode provided with the first and second internal electrodes via a substrate material layer. The first internal electrode, the second internal electrode, and the third electrode are connected to the input electrode, the output electrode, and the ground electrode, respectively.

In the piezoelectric oscillator, the first exterior substrate includes a first internal electrode connected to the input electrode, and a second internal electrode which is provided with the first internal electrode via a substrate material layer and which is connected to the ground electrode, and the second exterior substrate includes a third internal electrode connected to the output electrode, and a fourth internal electrode which is provided with the third internal electrode via a substrate material layer and which is connected to the ground electrode.

In the piezoelectric oscillator, no electrode is provided on the top surface of each of the exterior substrate.

In the piezoelectric oscillator, the first exterior substrate and the second exterior substrate each include a first substrate material layer which is liquid-sintered, and a second substrate material layer which is not sintered at the sintering temperature of the first substrate material layer.

Other features, elements, characteristics and advantages of the present invention will become more apparent from the following detailed description of preferred embodiments with reference to the attached drawings.

DETAILED DESCRIPTION OF PREFERRED EMBODIMENTS

Figure 1A:
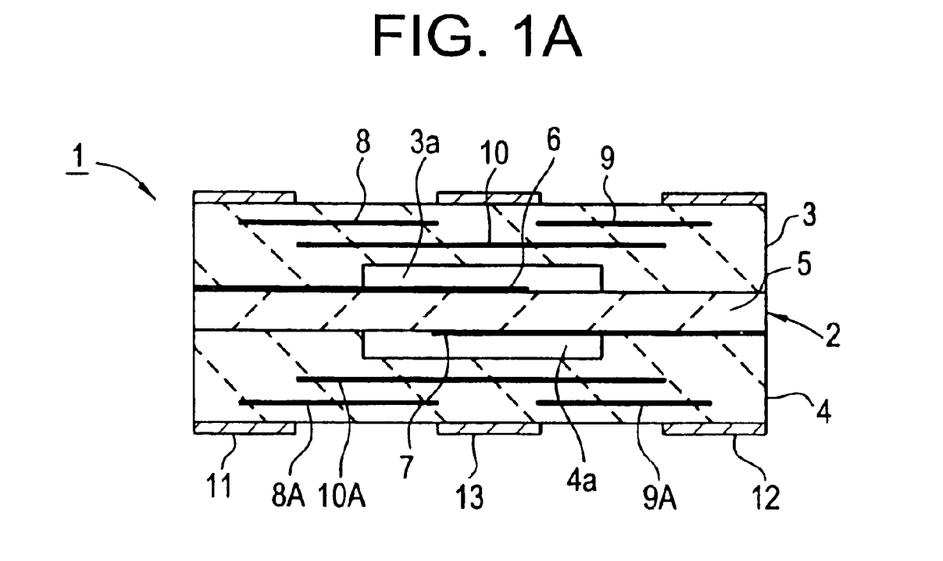
FIG. 1A is a cross-sectional view showing a piezoelectric oscillator according to a first preferred embodiment of the present invention.
Figure 1B:
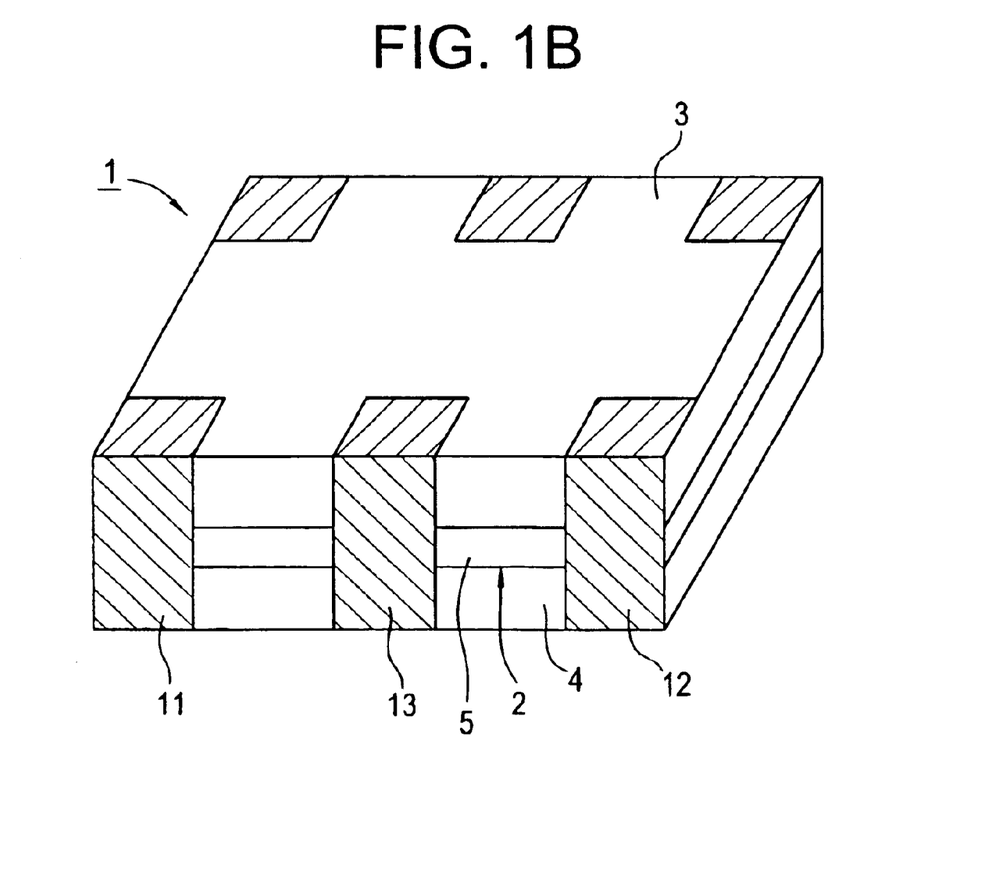
FIG. 1B is a perspective view showing the appearance of the piezoelectric oscillator of FIG. 1A.

FIGS. 1A and 1B show cross-sectional and outer perspective views, respectively, illustrating a built-in load capacitance type piezoelectric oscillator according to a first preferred embodiment of the present invention.

A piezoelectric oscillator 1 includes a plate-like piezoelectric resonating element 2 and first and second exterior substrates 3 and 4. The exterior substrates 3 and 4 are laminated over and under the piezoelectric resonating element 2.

Figure 2:
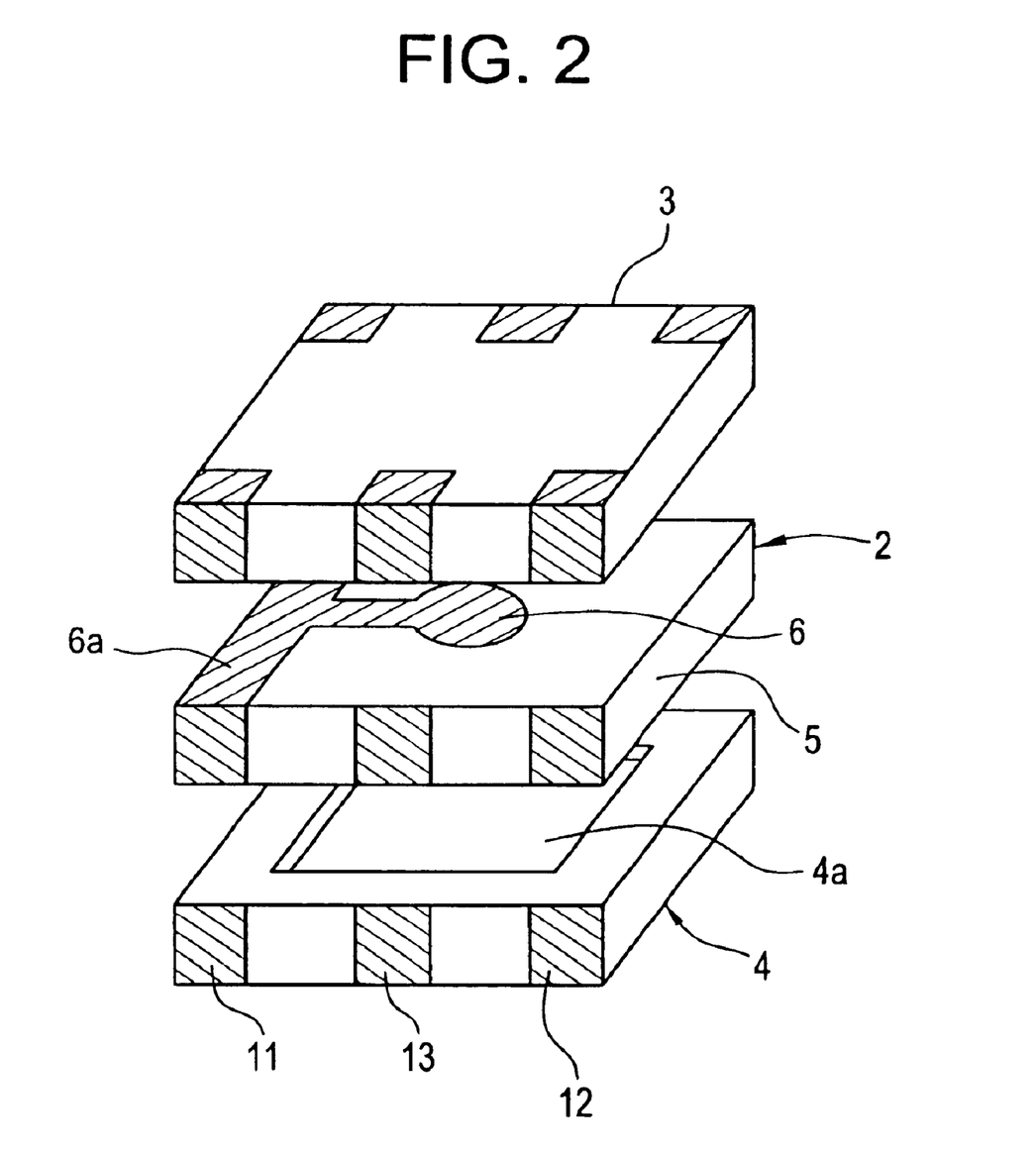
FIG. 2 is an exploded perspective view of the piezoelectric oscillator shown in FIGS. 1A and 1B.

As shown in an exploded perspective view in FIG. 2, the piezoelectric resonating element 2 is constructed using a substantially rectangular piezoelectric diaphragm 5. An excitation electrode 6 is provided on the top surface of the piezoelectric diaphragm 5 and an excitation electrode 7 is provided on the bottom surface thereof (FIG. 1A). The excitation electrodes 6 and 7 are arranged to face each other via the piezoelectric diaphragm 5 in the middle of the piezoelectric diaphragm 5, which constitutes an energy-trap type piezoelectric resonator component. The piezoelectric diaphragm 5 is constructed using piezoelectric ceramics, such as lead zirconate titanate series ceramics, or piezoelectric single crystal. In this preferred embodiment, the piezoelectric diaphragm 5 is constructed using lead zirconate titanate series ceramics. Polarization processing is applied to the diaphragm 5 in the thickness direction. Accordingly, in the piezoelectric resonating element 2, the energy-trap type piezoelectric resonator component that vibrates in a thickness longitudinal vibration mode is constructed.

The excitation electrode 6 is led to one end surface of a laminate body constructed by laminating the piezoelectric resonating element 2 and the exterior substrates 3 and 4 while the excitation electrode 7 is led to the other end surface thereof. The excitation electrode 6 is connected to the connection electrode 6a that is provided on the top surface of the piezoelectric diaphragm 5 to reach both side edges of the diaphragm 5. Here, the side edges mean the outer edges of the diaphragm 5 extending in the direction that connects both end surfaces of the laminate body. The excitation electrode 7 is connected to another connection electrode which is provided on the bottom surface so as to reach both side surfaces (not shown).

The exterior substrates 3 and 4 are each constructed using a multilayer substrate. In the present preferred embodiment, the exterior substrate 3 has first and second inner electrodes 8 and 9 provided at the same height level therein. Particularly, in the present preferred embodiment, a third internal electrode 10 is disposed above the piezoelectric element 2 so as to overlap the first and second internal electrodes 8 and 9 via a substrate material layer. The third internal electrode 10 does not overlap the first and second internal electrodes in the thickness direction.

Figure 3:
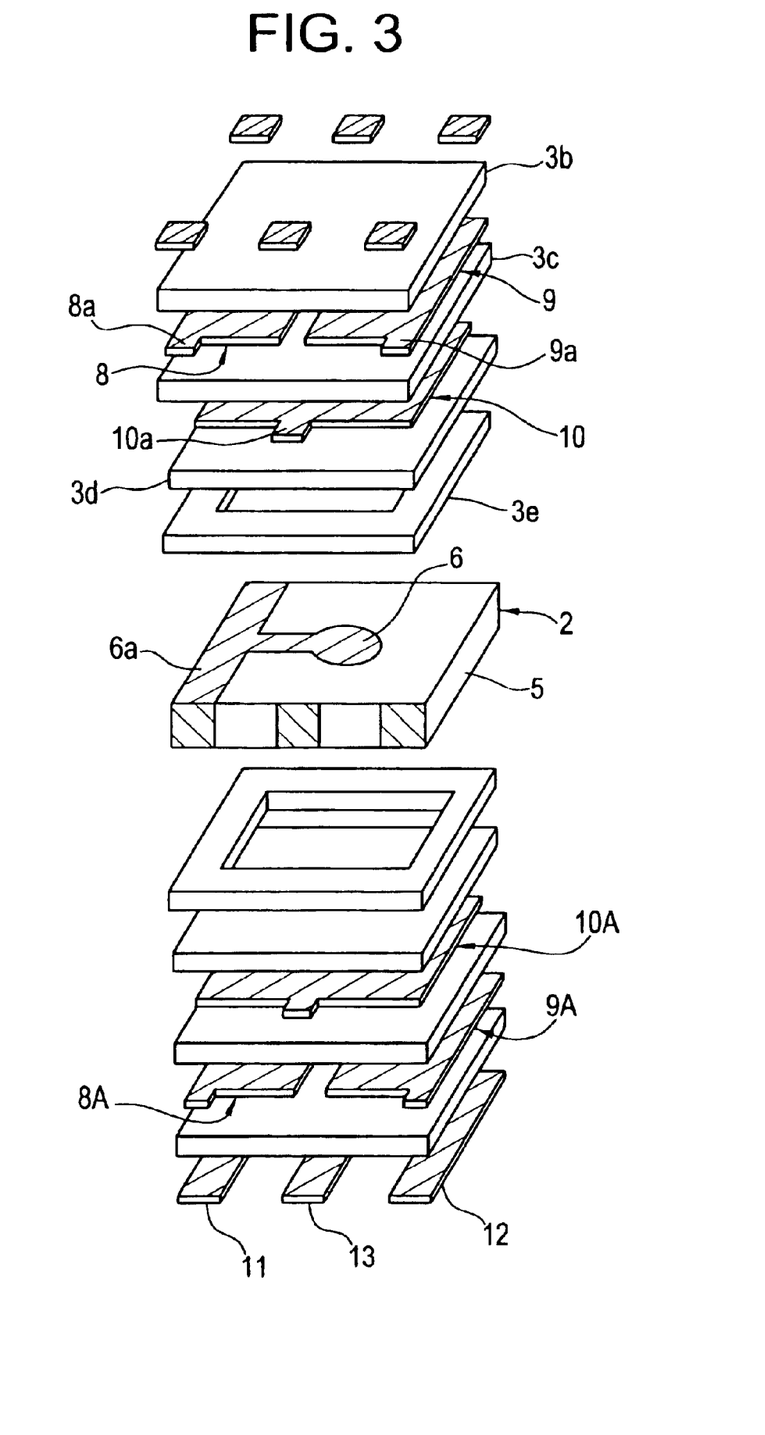
FIG. 3 is an exploded perspective view illustrating the construction of an exterior substrate of the piezoelectric oscillator in FIGS. 1A and 1B.

As shown in an exploded perspective view in FIG. 3, the first and second internal electrodes 8 and 9 include lead portions 8a and 9a, respectively, and the lead portions 8a and 9a extend to the side surfaces of the laminate body. The third internal electrode 10 includes a lead portion 10a which extends to a side surface of the laminate body.

As shown in FIG. 1, a concave portion 3a is included in a primary surface of the exterior substrate 3 which is the surface to be laminated on the piezoelectric resonating element 2. The concave portion 3a defines a space such that vibration of a vibration portion of the piezoelectric resonating element 2 is not prevented or hindered.

As shown in FIG. 3, the exterior substrate 3 is obtained by laminating a plurality of substrate material layers including layers 3b to 3e via the corresponding internal electrodes 8 to 10 and uniformly sintering these layers. That is, the exterior substrate 3 is easily obtained in accordance with a known manufacturing method of the multilayer substrate.

The second exterior substrate 4 is constructed in the same manner as in the first exterior substrate 3. That is, the second exterior substrate 4 includes the first, second, and third internal electrodes 8A, 9A, and 10A. There is a concave portion 4a in a primary surface of the second exterior substrate 4 which is the surface to be laminated on the piezoelectric resonating element 2.

The internal electrodes 10 and 10A which are connected to the ground are provided on the side of the piezoelectric resonating element 2, which means that the piezoelectric resonating element 2 is interposed therebetween.

After the exterior substrates 3 and 4 are laminated on the piezoelectric resonating element 2, the outer electrodes 11, 12, and 13 which define an input electrode, an output electrode, and a ground electrode, respectively, are provided on the surface of the piezoelectric oscillator 1. The input electrode 11, the output electrode 12, and the ground electrode 13 are formed by applying evaporation, plating, or sputtering to conductive material, or by coating conductive paste to conductive material and then curing it.

In the present preferred embodiment, a three-terminal type piezoelectric oscillator, in which the input electrode 11, the output electrode 12, and the ground electrode 13 are external electrodes, is constructed. That is, the first internal electrodes 8 and 8A are electrically connected to the input electrode 11 at the side surfaces of the laminate body, the second internal electrodes 9 and 9A are electrically connected to the output electrode 12 at the side surfaces thereof, and the third internal electrodes 10 and 10A are electrically connected to the ground electrode 13 at the side surfaces thereof.

The excitation electrodes 6 and 7 of the piezoelectric resonating element 2 is electrically connected to the input electrode 11 and the output electrode 12, respectively. Therefore, the input electrode 11 and the ground electrode 13 have a capacitor including the first internal electrode 8 and the third internal electrode 10 and a capacitor including the first electrode 8A and the third electrode 10A disposed therebetween and such that the capacitors are connected in parallel. The output electrode 12 and the ground electrode 13 have a capacitor including the second internal electrode 9 and the third internal electrode 10 and a capacitor including the second internal electrode 9A and the third internal electrode 10A disposed therebetween and such that these capacitors are connected in parallel.

Since the first and second exterior substrates 3 and 4 are constructed using the multilayer substrate and the above-described capacitors are constructed in each of the exterior substrates 3 and 4, the built-in load capacitance type piezoelectric oscillator 1 having high capacitance is constructed.

Furthermore, since the piezoelectric oscillator 1 has a construction in which plate-like exterior substrates 3 and 4 are laminated over and under the piezoelectric resonating element 2, and the input electrode 11, the output electrode 12, and the ground electrode are vertically symmetrical, the piezoelectric oscillator 1 is non-directional. Therefore, the piezoelectric oscillator 1 is easily surface-mounted on a printed circuit board.

Since the piezoelectric oscillator 1 has a construction in which the plate-like piezoelectric exterior substrates 3 and 4 are laminated over and under, respectively, the piezoelectric resonating element 2, it is easily shortened as compared to a capped piezoelectric component. In addition, miniaturization thereof is further improved.

Since a capacitor is obtained by providing at least one layer of the internal electrode in the exterior substrates 3 and 4, a capacitor having high capacitance is easily constructed. Therefore, a low dielectric-constant ceramic such as alumina or magnesium titanate can be used as a constituent material of the exterior substrates 3 and 4. Accordingly, since there is no need to use dielectric material having a high dielectric constant which is less workable, the exterior substrates 3 and 4 each have excellent workability. That is, chipping and other defects do not occur when each built-in load capacitance type piezoelectric oscillator is cut from a mother laminate body.

For example, when the chip-type piezoelectric oscillator 1 having a plane shape of an area of about 2.5 mm by about 2.0 mm is constructed, even though the exterior substrates 3 and 4 are constructed using magnesium titanate series ceramic having a relative dielectric constant of approximately 20, a capacitance of approximately 20 pF is obtained in one layer of the exterior substrate in which the thickness of the ceramic layer between internal electrodes is approximately 7 $\mu$m and the overlapping area of these electrodes is about 0.80 mm$^2$.

In a conventional piezoelectric component shown in FIG. 9, when the piezoelectric component is constructed having the same dimensions as the above-described component, even though the exterior substrates are constructed using lead zirconate titanate series ceramic having a high dielectric constant (a relative dielectric constant $\epsilon$ of approximately 200), a capacitance of at most 15 pF is obtained. That is, when the high dielectric constant ceramic is used, for the above-described workability reasons, only one exterior substrate is constructed using the high dielectric constant ceramic. Accordingly, when the conventional piezoelectric component is constructed having the same dimensions as those of the piezoelectric oscillator 1 in the present preferred embodiment, the conventional component cannot obtain high capacitance compared to the oscillator 1.

In the present preferred embodiment, the internal electrodes 8 to 10 and internal electrodes 8A to 10A are simultaneously sintered along with ceramic material constituting the exterior substrates 3 and 4. The input electrode 11, output electrode 12, and ground electrode 13 are simultaneously sintered along with the ceramic material after conductive paste coated on the laminate body. Alternatively, the input electrode 11, output electrode 12 and ground electrode 13 may be separately formed after the laminate body is obtained.

In the present preferred embodiment, even when the exterior substrates 3 and 4 are constructed using low relative dielectric constant ceramic material, greatly increased capacitance is obtained. Accordingly, the exterior substrates 3 and 4 are constructed using ceramic material in which deflective strength is high and in which chipping and other defects rarely occur. This enables the exterior substrates 3 and 4 to have a very thin wall construction, whereby the built-in load capacitance type piezoelectric oscillator having a thin-walled construction and greatly increased capacitance is achieved.

In addition, since the internal electrodes 8 to 10 and internal electrodes 8A to 10A are embedded, the mechanical strength of the exterior substrates 3 and 4 is greatly enhanced, which facilitates thinning of the substrates 3 and 4.

Alternatively, a dummy electrode which is connected to neither of the electrodes 11 to 13 may be embedded, so that mechanical strength of the exterior substrates 3 and 4 is further enhanced.

In addition, in the foregoing conventional example, warping often occurs in the exterior substrates, which causes cracking or chipping. However, by arranging the internal electrodes 8 to 10 and internal electrodes 8A to 10A as in the present preferred embodiment, warping of the substrates is greatly reduced. That is, by arranging the internal electrodes so that they face external electrodes via the ceramic layer, warping of the substrates is prevented.

In the piezoelectric oscillator 1 according to the first preferred embodiment, each of the exterior substrates 3 and 4 includes the capacitor connected between the input electrode 11 and the ground electrode 13 and the capacitor connected between the output electrode 12 and the ground electrode 13. Therefore, even though connection failure may occur among the electrodes 11 to 13 in either of the exterior substrates, as long as electrical connection in the other exterior substrate is secured, the corresponding capacitors are securely connected between the input electrode 11 and the ground electrode 13 and between the output electrode 12 and the ground electrode 13. Even if the above-described difficulty occurs in one of the exterior substrates 3 and 4, the possibility of occurrence of a serious accident such as oscillation stoppage or hindrance is greatly decreased.

In the first preferred embodiment, the exterior substrates 3 and 4 preferably have the same internal electrode construction. However, the exterior substrates 3 and 4 may be appropriately different in terms of the number of laminated internal electrodes, the thickness of the ceramic layer between the internal electrodes, and other aspects.

Although, in the first preferred embodiment, the number of the ceramic layers in which the capacitance is obtained among the internal electrodes is one, capacitance may be obtained based on more than one ceramic layer by laminating more than two internal electrodes.

Figure 4:
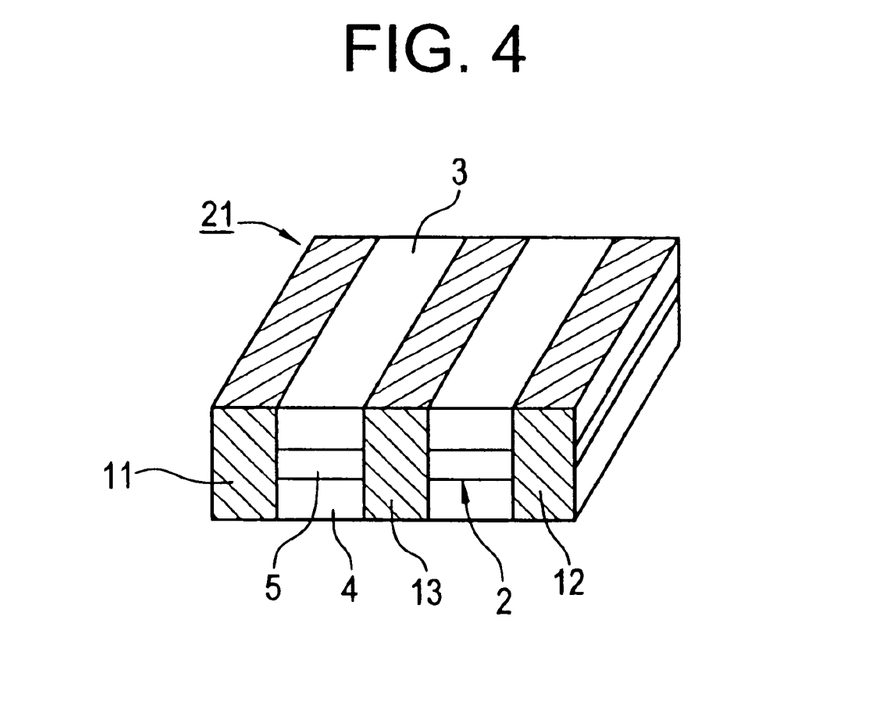
FIG. 4 is a perspective view showing the appearance of a piezoelectric oscillator according to a modified example of the first preferred embodiment.
Figure 5:
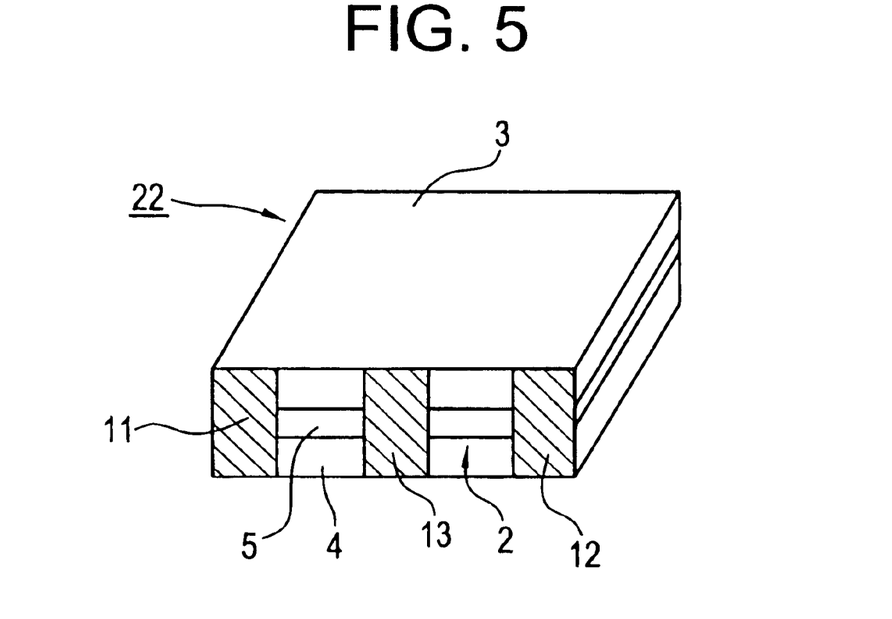
FIG. 5 is a perspective view showing the appearance of a piezoelectric oscillator according to another modified example of the first preferred embodiment.

FIGS. 4 and 5 each are perspective views showing modified examples of the piezoelectric oscillator according to the first preferred embodiment. In a piezoelectric oscillator 21 according to the modified example shown in FIG. 4, the input electrode 11, output electrode 12, and ground electrode 13 are wound around the top surface, a pair of the side surfaces, and the bottom surface of the laminate body, which includes the exterior substrates 3 and 4 and the piezoelectric resonating element 2. Thus, the external electrodes 11 to 13 are wound around the surrounding of the laminate body.

As a piezoelectric oscillator 22 shown in FIG. 5, the external electrodes 11 to 13 are arranged so as not to reach the top surface of the laminate body. However, they are arranged so as to reach the bottom surface and a pair of the side surfaces of the laminate body, which is not clearly shown in FIG. 5. When the input electrode 11, the output electrode 12, and the ground electrode 13 are arranged such that no electrode is provided on the top surface, the piezoelectric oscillator having no electrode provided on the top surface is obtained.

Therefore, when the piezoelectric oscillator 1 is mounted on the printed circuit board or other suitable component, another electronic component can be disposed on the top surface of the piezoelectric oscillator 1. In addition, this construction prevents short-circuiting from occurring between the other component and the oscillator 1.

As is clear from the modified examples shown in FIGS. 4 and 5, since, in the piezoelectric oscillator 1, the capacitances are provided inside the exterior substrates 3 and 4, the shapes of the external electrodes 11 to 13 can be altered.

Figure 6A:
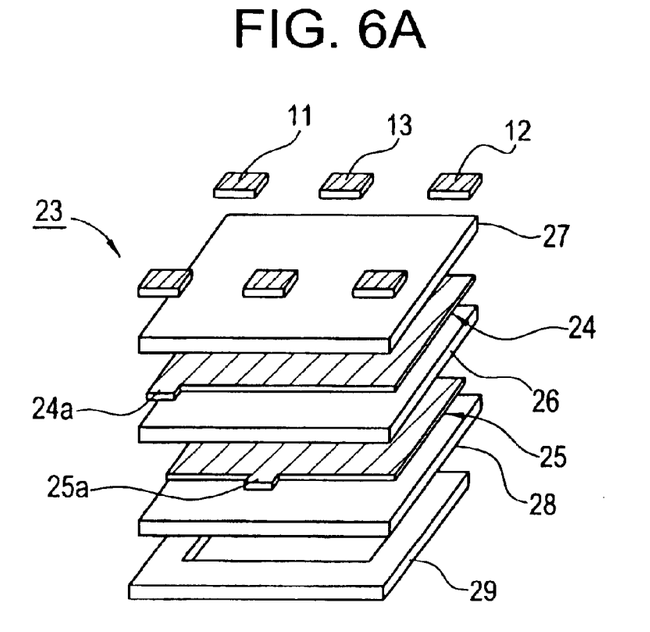
FIGS. 6A and 6B are exploded perspective views showing first and second exterior substrates, respectively, used in a piezoelectric oscillator according to a second preferred embodiment of the present invention.
Figure 6B:
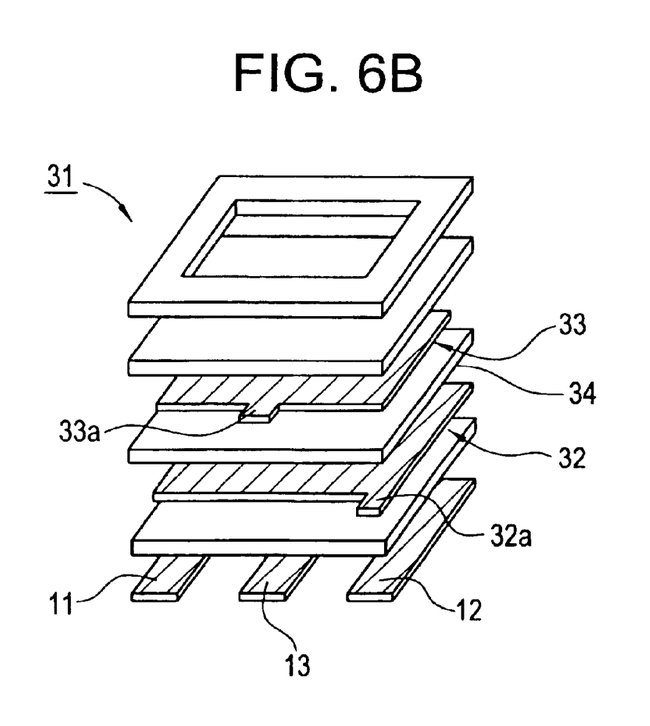

FIGS. 6A and 6B are exploded perspective views illustrating the corresponding constructions of the first and second exterior substrates according to a second preferred embodiment of the present invention. The exterior substrates in FIGS. 6A and 6B correspond to the upper portion and lower portion, respectively, of the exploded perspective view in FIG. 3.

As shown in FIG. 6A, in a first exterior substrate 23, a first internal electrode 24 and second internal electrode 25 are laminated via a ceramic layer 26. Apart from the ceramic layer 26, the first exterior substrate 23 further includes ceramic layers 27, 28, and 29. In the same manner as in the first preferred embodiment, the external electrodes 11 to 13 define the input electrode, the output electrode, and the ground electrode, respectively.

In this second preferred embodiment, the first internal electrode 24 includes a lead part 24a which is led to a side surface of the laminate body. Accordingly, the first internal electrode 24 is electrically connected to side surface portions of the exterior substrate of the input electrode 11 (the input electrode 11 is preferably constructed in the same manner as in the first preferred embodiment although it is not shown).

The second internal electrode 25 is arranged so as to overlap the first internal electrode 24 via the ceramic layer 26, which is a substrate material layer. The second internal electrode 25 includes a lead portion 25a. The lead portion 25a extends to the approximate middle portion of the laminate body whereby the second internal electrode 25 is electrically connected to side surface portions of the exterior substrate of the ground electrode 13 (the ground electrode 13 is preferably constructed in the same manner as in the first preferred embodiment although it is not shown). Consequently, in the first exterior substrate 23, a capacitor including the first and second internal electrodes 24 and 25 is connected between the input electrode 11 and the ground electrode 13. The first and second internal electrodes 24 and 25 are not necessarily constructed so as to overlap in the thickness direction.

As shown in FIG. 6B, in the second exterior substrate 31, third and fourth internal electrodes 32 and 33 are laminated via a ceramic layer 34. The third internal electrode 32 includes a lead portion 32a which is led to the proximity of one end surface of the laminate body in a side surface thereof, whereby electrical connection between the third internal electrode 32 and the output electrode 12 is established. The fourth internal electrode 33 includes a lead portion 33a which extends to the approximate middle portion of the side surface, whereby electrical connection between the fourth electrode 33 and the ground electrode 13 is established.

Therefore, in the second exterior substrate 31, a capacitor connected between the output electrode 12 and the ground electrode 13 is provided. The third and fourth internal electrodes 32 and 33 are not necessarily constructed so as to overlap in the thickness direction.

In the second preferred embodiment, the capacitor connected between the input electrode 11 and the ground electrode 13 is provided in the first exterior substrate 23 and the capacitor connected between the output electrode 12 and the ground electrode 13 are provided in the second exterior substrate 31. In this manner, the capacitors are distributed between the first and second exterior substrates 23 and 31. In this case, as is obvious from FIG. 6, since the internal electrodes 24, 25, 32, and 33 is provided having an area covering substantially the entirety of the corresponding exterior substrates 23 and 31, a greatly increased capacitance is obtained.

Furthermore, in the second preferred embodiment, by increasing the number of layers of the first and second internal electrodes 24 and 25, and of the third and fourth internal electrodes 32 and 33, further increased capacitance is obtained.

The piezoelectric oscillator according to the second preferred embodiment differs from the piezoelectric oscillator 1 according to the first preferred embodiment in that the exterior substrates 23 and 31 are provided.

Therefore, in the same manner as in the first preferred embodiment, this second preferred embodiment provides a built-in load capacitance type piezoelectric oscillator which is shortened, miniaturized, and has a greatly increased capacitance incorporated therein.

In the piezoelectric oscillator according to the second preferred embodiment, the internal electrodes 32 and 33 correspond to the first and second internal electrodes, respectively, in the first preferred embodiment.

Figure 7:
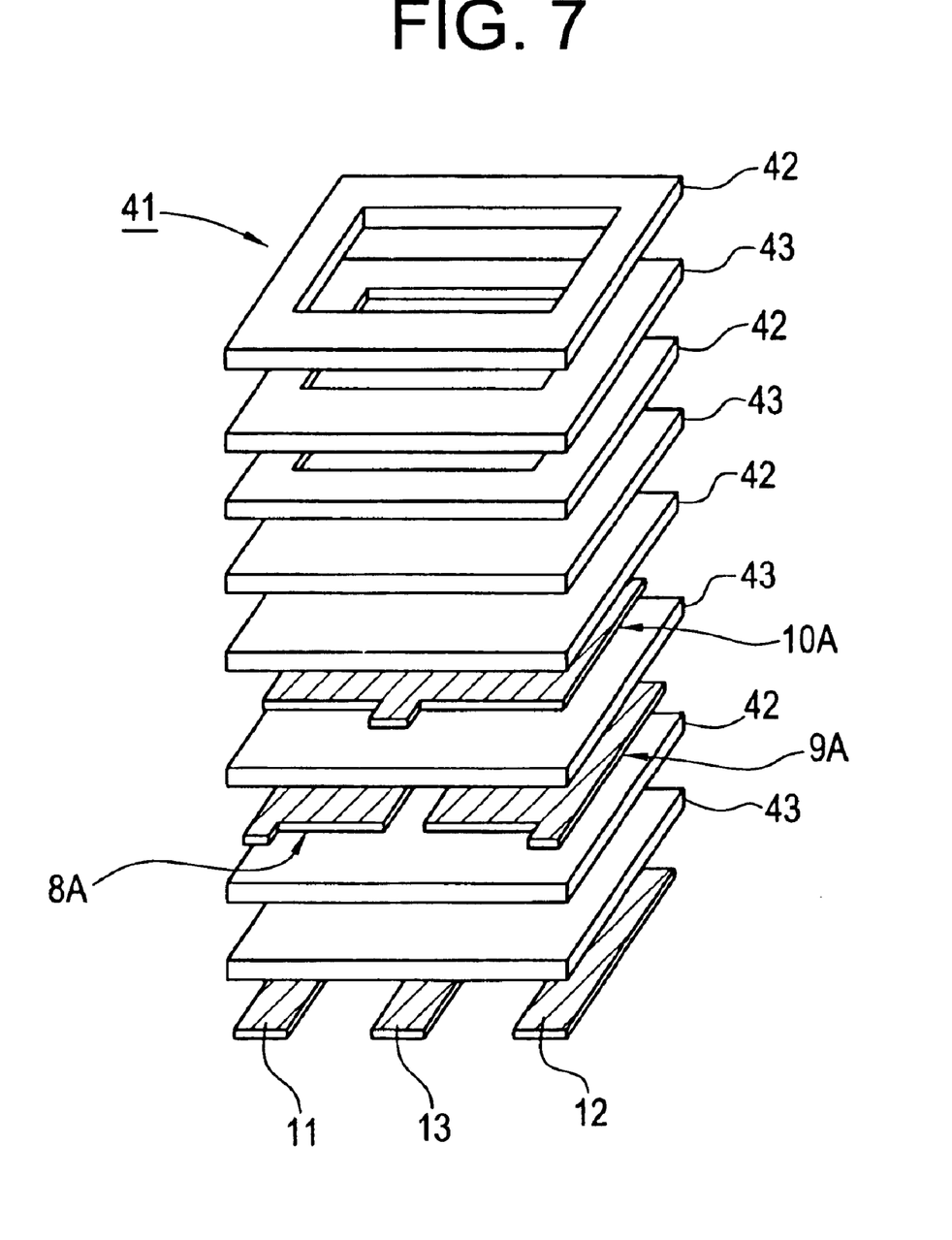
FIG. 7 is an exploded perspective view showing the construction of an exterior substrate of a piezoelectric oscillator according to a third preferred embodiment.

FIG. 7 is an exploded perspective view showing the construction of a lower exterior substrate of a piezoelectric oscillator according to a third preferred embodiment of the present invention.

Apart from the substrate material layer that constitutes an exterior substrate 41, the piezoelectric oscillator according to the third preferred embodiment preferably has the same construction as the oscillator 1 according to the first preferred embodiment.

As shown in FIG. 7, the first internal electrode 8A and second internal electrode 9A are located at the same height level in the same manner as in the first preferred embodiment. The third internal electrode 10A is arranged so as to overlap the internal electrodes BA and 9A via the ceramic layer. These internal electrodes 8A to 10A, the input electrode 11, the output electrode 12, and the ground electrode 13 are constructed in the same manner as in the first preferred embodiment.

That is, the exterior substrate 41 has a first substrate material layer 42 including ceramic material which is liquid-sintered and a second substrate material layer 43 including ceramic material which is not sintered at the sintering temperature of the first substrate material layer 42. The first and second substrate material layers 42 and 43 are alternately laminated.

The first substrate material layer is constructed using, for example, glass or glass-ceramic. Specifically, it is constructed using crystallized glass, such as anorthite series crystallized glass, forsterite series crystallized glass, cordierite series crystallized glass, or celsian series crystallized glass; or non-crystallized glass, such as $SiO_2$—$MgO$—$Al_2O_3$ series, $SiO_2$—$Al_2O$ series, $SiO_2$—$Al_2O_3$—$CaO$ series, $SiO_2$—$Al_2O_3$—$BaO$ series, or $SiO_2$—$CaO$ series.

The second substrate material layer which is not sintered at the sintering temperature of the first substrate material layer is constructed using inorganic solid powder having high melting point. $Al_2O_3$, $BaTiO_3$, $ZrO_2$, or mullite, or a mixture of these is used as the inorganic solid powder.

However, as long as the second substrate material layer has a sufficiently higher softening point than the first substrate material layer, which is liquid-sintered, and as long as it is not sintered at the sintering temperature of the first substrate material layer, not only the inorganic solid powder but also glassy material may be used.

In the third preferred embodiment, the first material layer 42 and the second substrate material layer 43 are alternately laminated. The first substrate material layer is normally sintered between about 800° C. and about 1000° C. In this case, since the second substrate material layer is not sintered, the material which constitutes the first material layer permeates into the second substrate material layer and then the substrate is completed as an integral multilayer substrate while the inorganic solid powder and other suitable material which constitute the second substrate material layer remain unsintered. Since shrinkage of the first substrate material layer due to sintering is prevented by the second substrate material layer, shrinkage in a surface parallel to a primary surface of the multilayer substrate due to sintering hardly occurs. Therefore, dimensional accuracy of the multilayer is greatly improved.

In the present preferred embodiment, the first substrate material layer 42 and the second substrate material layer 43 are alternately laminated so that the second substrate material substrate prevents the first substrate material layer from shrinking due to sintering. However, those layers are not necessarily alternately laminated. In addition, in the present preferred embodiment, the first substrate material layer is provided between the internal electrodes 8A and 9A and the internal electrode 10A, whereby capacitance is provided by the first substrate material layer. However, capacitance may be provided by the second substrate material layer.

Although only the lower exterior substrate 41 is shown in FIG. 7, the first exterior substrate, in other words, the upper exterior substrate, is constructed in the same way.

Therefore, in the piezoelectric oscillator according to the third preferred embodiment, the exterior substrate is highly accurately constructed in the above-described manner. Furthermore, the construction in which the first and second substrate material layers are laminated in the above-described manner produces greatly increased strength of the exterior substrate. For example, while the conventional exterior substrate using barium titanate series ceramics and the conventional dielectric substrate using magnesium titanate series ceramics have deflective strengths of about 800 kg/cm$^2$ to about 1000 kg/cm$^2$ and of about 1000 kg/cm$^2$ to about 1500 kg/cm$^2$, respectively, the exterior substrate 41 has a deflective strength of about 2000 kg/cm$^2$ or above when the thickness thereof is substantially equal to that of the conventional exterior substrate. Therefore, an exterior substrate which has greatly improved accuracy and strength is constructed. This allows the thickness of the exterior substrate to be reduced. Accordingly, miniaturization and shortening of the piezoelectric oscillator are further greatly improved.

Since the sintering temperature of the exterior substrate 41 constructed by laminating the first and second substrate material layers is between about 800° C. and about 1000° C., and it is lower than that of the conventional dielectric ceramic substrate, which is between about 1200° C. and about 1300° C. Therefore, sintering costs and manufacturing costs of the piezoelectric oscillator are greatly reduced.

In the third preferred embodiment, although a plurality of the first substrate material layers 42 and the second substrate material layers 43 are alternately laminated, in either of the first substrate material layer 42 and the second substrate material layer 43, at least only one layer thereof is sufficient. For example, as shown in FIG. 8A, in the external substrate 41A, by providing a single first substrate material layer 42 as an interposed layer between the internal electrodes 8A and 9A and the internal electrode 10A, the second substrate material layers 43 may be provided over and under the first substrate material layer 42.

Figure 8A:
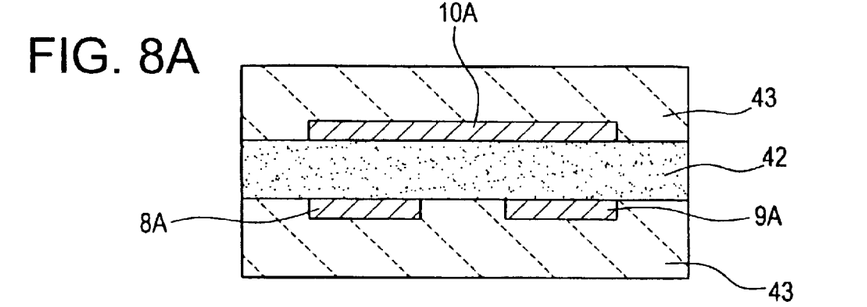
FIGS. 8A to 8D are cross-sectional views illustrating modified examples of the piezoelectric oscillator according to the third preferred embodiment.
Figure 8B:
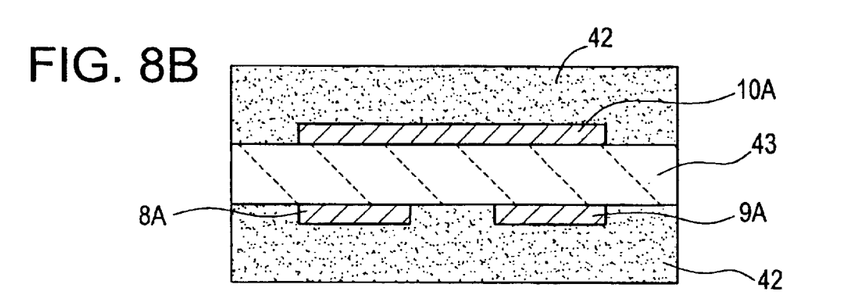

On the contrary, as shown in FIG. 8B, by providing the second substrate material layer 43 between the internal electrodes 8A and 9A and the internal electrode 10A, the first substrate material layers 42 may be provided over and under the second substrate material layer 43.

Figure 8C:
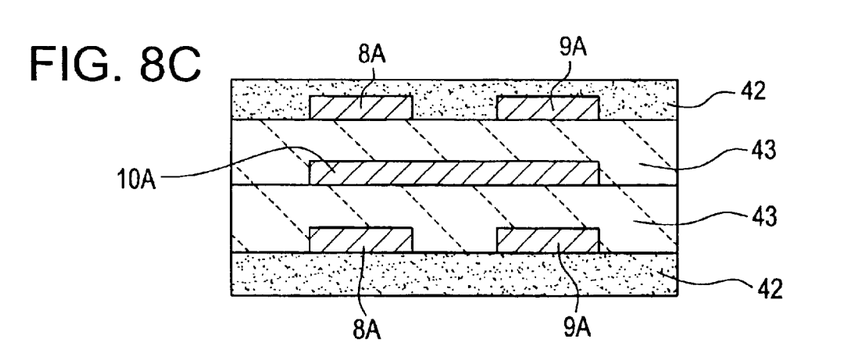

Alternatively, as shown in FIG. 8C, the second substrate material layer 43 is provided between the internal electrodes 8A and 9A and the internal electrode 10A, another pair of the internal electrodes 8A and 9A is provided above the internal electrode 10A, the second substrate material layer 43 is provided between the other pair of the internal electrodes 8A and 9A and the internal electrode 10A, and the first material layers 42 and 42 are laminated in the upper portion and the lower portion of the exterior substrate, respectively.

Figure 8D:
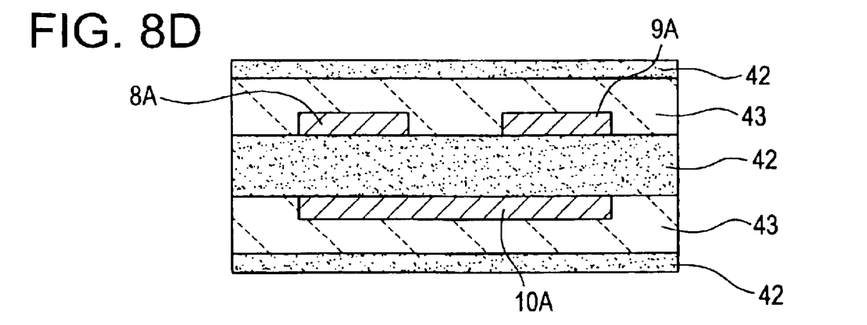

As shown in FIG. 8D, the first substrate material layers 42 and 42 are laminated at the topmost portion and bottommost portion, respectively, of the exterior substrate shown in FIG. 8A.

The internal electrodes 8A, 9A, and 10A are simultaneously sintered along with the first and second substrate material layers 42 and 43 constituting the exterior substrate. In the same manner as in the first preferred embodiment, the input electrode, the output electrode, and the ground electrode may be simultaneously sintered along with the exterior substrate 41, or those external electrodes may be formed after the sintered exterior substrate is laminated on the piezoelectric resonating element.

In the first to third preferred embodiments, the built-in load capacitance type piezoelectric oscillator obtained by integrating the piezoelectric resonating element with the three-terminal capacitor is used. However, the present invention can be generally applied to the piezoelectric resonator obtained by integrating the piezoelectric resonating element with the capacitor.

While the invention has been particularly shown and described with reference to preferred embodiments, it will be understood by those skilled in the art that the foregoing and other changes in form and details can be made without departing from the spirit and scope of the invention.

What is claimed is:

1. A piezoelectric resonator comprising:
   a piezoelectric resonating element; and
   a first exterior substrate and a second exterior substrate laminated over and under, respectively, on said piezoelectric resonating element;
   wherein each of said first exterior substrate and said second exterior substrate includes a multilayer substrate having at least one layer of an internal electrode;
   said first exterior substrate and said second exterior substrate each includes a first substrate material layer which is liquid-sintered and a second substrate material layer which has a sintering temperature greater than the sintering temperature of said first substrate material layer; and
   each of said first exterior substrate and said second exterior substrate has a deflective strength of at feast 2000 kg/cm$^2$.

2. A piezoelectric resonator according to claim 1, wherein said first exterior substrate and said second exterior substrate each have a first internal electrode and a second internal electrode provided via a substrate material layer and each have a capacitor provided therein.

3. A piezoelectric resonator according to claim 1, wherein each of said first exterior substrate and said second exterior substrate includes a pair of a first internal electrode and a second internal electrode provided at the same height level, a third internal electrode provided with the first and second internal electrodes via a substrate material layer, and capacitors provided between said first internal electrode and said third internal electrode and between said second internal electrode and said third internal electrode, respectively.

4. A piezoelectric resonator according to claim 2, wherein the first internal electrode of said first exterior substrate and the first internal electrode of said second exterior substrate are connected to a first electric potential and a second electric potential, respectively, and the second internal electrode of said first exterior substrate and said second exterior substrate are each grounded.

5. A piezoelectric resonator according to claim 1, further comprising a ground electrode wound around a top surface, a pair of side surfaces, and a bottom surface of a laminate body defined by the first and second exterior substrates and the piezoelectric resonating element.

6. A piezoelectric resonator according to claim 1, wherein a concave portion is included in a primary surface of said first and second exterior substrates which and the primary surface defines the surface to be laminated on the piezoelectric resonating element, the concave portion defines a space such that vibration of the piezoelectric resonating element is not hindered.

7. A piezoelectric oscillator comprising:
   a built-in load capacitance type piezoelectric oscillator including:
   a piezoelectric resonating element; and
   a first exterior substrate and a second exterior substrate, which are laminated over and under, respectively, said piezoelectric resonating element, end which constitutes a three-terminal capacitor connected to said piezoelectric resonating element; wherein said first exterior substrate and said second exterior substrate each includes a multilayer substrate having at least one layer of an Internal electrode;

said first exterior substrate and said second exterior substrate each includes a first substrate material layer which is liquid-sintered and a second substrate material layer which has a sintering temperature greater than the sintering temperature of said first substrate material layer; and each of said first exterior substrate and said second exterior substrate has a deflective strength of at least 2000 kg/cm$^2$.

8. A piezoelectric oscillator according to claim 7, further comprising an input electrode, an output electrode, and a ground electrode provided on the surface of a laminate body defined by said piezoelectric resonating element, said first exterior substrate, and said second exterior substrate, wherein said input electrode, said output electrode, and said ground electrode are connected to the corresponding terminals of said three-terminal capacitor constituted by said first exterior substrate and said second exterior substrate.

9. A piezoelectric oscillator according to claim 8, wherein each of said first exterior substrate and said second exterior substrate each includes a pair of a first internal electrode and a second internal electrode provided at the same height level, a third internal electrode provided with the first and second internal electrodes via a substrate material layer, and said first internal electrode, said second internal electrode, and said third electrode are connected to said input electrode, said output electrode, and said ground electrode, respectively.

10. A piezoelectric oscillator according to claim 8, wherein said first exterior substrate includes a first internal electrode connected to said input electrode and a second internal electrode which is provided with said first internal electrode via a substrate material layer and which is connected to said ground electrode, and said second exterior substrate includes a third internal electrode connected to said output electrode and a fourth internal electrode which is provided with said third internal electrode via a substrate material layer and which is connected to said ground electrode.

11. A piezoelectric oscillator according to claim 7, wherein no electrode is provided on the top surface of each of said first exterior substrate and said second exterior substrate.

12. A piezoelectric oscillator according to claim 7, further comprising a ground electrode wound around a top surface, a pair of side surfaces, and a bottom surface of a laminate body defined by the first and second exterior substrates and the piezoelectric resonating element.

13. A piezoelectric oscillator according to claim 7, wherein a concave portion is included in a primary surface of said first and second exterior substrates which and the primary surface defines the surface to be laminated on the piezoelectric resonating element, the concave portion defines a space such that vibration of the piezoelectric resonating element is not hindered.

* * * * *